United States Patent [19]

Boehm et al.

[11] Patent Number: 5,530,362
[45] Date of Patent: Jun. 25, 1996

[54] METHOD AND SYSTEM FOR DETERMINING EXAMS REMAINING IN BATTERY POWERED MOBILE X-RAY DEVICES

[75] Inventors: Manfred D. Boehm; Michael J. Pajerski, both of Waukesha, Wis.

[73] Assignee: General Electric Company, Milwaukee, Wis.

[21] Appl. No.: 381,658

[22] Filed: Jan. 31, 1995

[51] Int. Cl.⁶ .................................................. G01N 27/416
[52] U.S. Cl. .......................... 324/427; 324/435; 340/636; 364/483; 378/102
[58] Field of Search ..................... 324/426, 427, 324/433, 435; 340/636; 320/48; 378/102, 162, 165; 364/481, 483

[56] References Cited

U.S. PATENT DOCUMENTS

| | | | |
|---|---|---|---|
| 4,553,081 | 11/1985 | Koenck | 320/48 X |
| 4,797,907 | 1/1989 | Anderton | 378/102 X |
| 4,947,123 | 8/1990 | Minezawa | 324/427 |
| 4,952,862 | 8/1990 | Biagetti et al. | 324/427 X |
| 5,278,487 | 1/1994 | Koenck | 320/21 |
| 5,317,269 | 5/1994 | Mills et al. | 324/427 |
| 5,394,089 | 2/1995 | Clegg | 324/427 |

*Primary Examiner*—Kenneth A. Wieder
*Assistant Examiner*—Diep Do
*Attorney, Agent, or Firm*—B. Joan Haushalter; John H. Pilarski

[57] ABSTRACT

A mobile x-ray unit operates from a rechargeable battery in a number of different modes which draw current from the battery. The present invention determines the number of patient exams remaining in the mobile x-ray unit, and has the capability of monitoring battery capacity usage as well as displaying information. The current drawn from the battery is measured as the system operates, which allows for the remaining capacity of the battery to be calculated. The remaining capacity of the battery can be adjusted based on usage of the system in each particular application. The system then calculates patient exams remaining based on the adjusted calculated remaining capacity of the battery, and displays the calculated patient exams remaining.

9 Claims, 2 Drawing Sheets

METHOD AND SYSTEM FOR DETERMINING EXAMS REMAINING IN BATTERY POWERED MOBILE X-RAY DEVICES

TECHNICAL FIELD

The present invention relates to battery powered medical equipment and, more particularly, indicators of the patient exams remaining before battery capacity is exhausted on such equipment.

BACKGROUND ART

Mobile equipment is often battery powered so that it can be moved to any location and used without the need of an electrical power outlet. One such device, for example, is a battery powered mobile x-ray device (BPMXD) which is moved from patient-to-patient throughout the hospital such as, for example, in emergency, intensive care, pediatrics and surgery. Such units must always have enough battery capacity available to produce a diagnostically useful x-ray, and if it is self-propelled, enough capacity to return the unit to its recharging station.

Battery powered medical equipment requires some means for indicating the remaining battery capacity. Typically, this takes the form of a percent full gauge or display based on battery voltages, which indicates the approximate state-of-charge of the battery. The battery voltage drops very little over much of the battery's usable capacity, and drops linearly over an even smaller portion of its usable capacity. Consequently, this method of indicating battery capacity is not reliable. However, to be useful, radiological technicians would like to know how many patient exams the percent capacity display represents.

One solution considered is to simply change the "battery capacity remaining" display to "PATIENT EXAMS REMAINING". However, this would not be practical, since all BPMXD's are used differently. For example, one hospital may park a BPMXD in one location but travel throughout the hospital to do patient exams. This BPMXD would use a substantial amount of battery capacity for each patient exam. Another BPMXD may be located in a surgery room and for sterile reasons never leave that room. This particular BPMXD would use very little battery capacity for each patient exam.

It would be desirable then to have a means for implementing a "PATIENT EXAMS REMAINING" (PER) feature, indicating the patient exams remaining before battery capacity is exhausted, in any BPMXD that has the capability of monitoring battery capacity usage as well as displaying PER. Furthermore, it would be desirable for the PER function to be capable of operating properly for a wide range of usage.

SUMMARY OF THE INVENTION

A mobile x-ray unit operates from a rechargeable battery in a number of different modes which draw current from the battery. The present invention is a method and system for implementing a Patient Exams Remaining feature in any battery powered mobile x-ray device that has the means of monitoring battery capacity usage as well as a means of displaying information.

In accordance with one aspect of the present invention, current drawn from the battery is measured as the system operates, which allows for the remaining capacity of the battery to be calculated. The remaining capacity of the battery can be adjusted based on usage of the system in each particular application. The system then calculates patient exams remaining based on the adjusted calculated remaining capacity of the battery, and displays the calculated patient exams remaining.

Accordingly, it is an object of the present invention to provide a means for displaying the number of patient exams that can be accomplished with the existing battery capacity of any battery powered mobile x-ray device. Other objects and advantages of the invention will be apparent from the following description, the accompanying drawings and the appended claims.

DETAILED DESCRIPTION OF THE PREFERRED EMBODIMENTS

The present invention provides a means for calculating and displaying the number of patient exams that can be accomplished with the existing battery capacity of any battery powered mobile x-ray device that has the ability to monitor battery capacity usage as well as the ability to display information.

Figure 1:
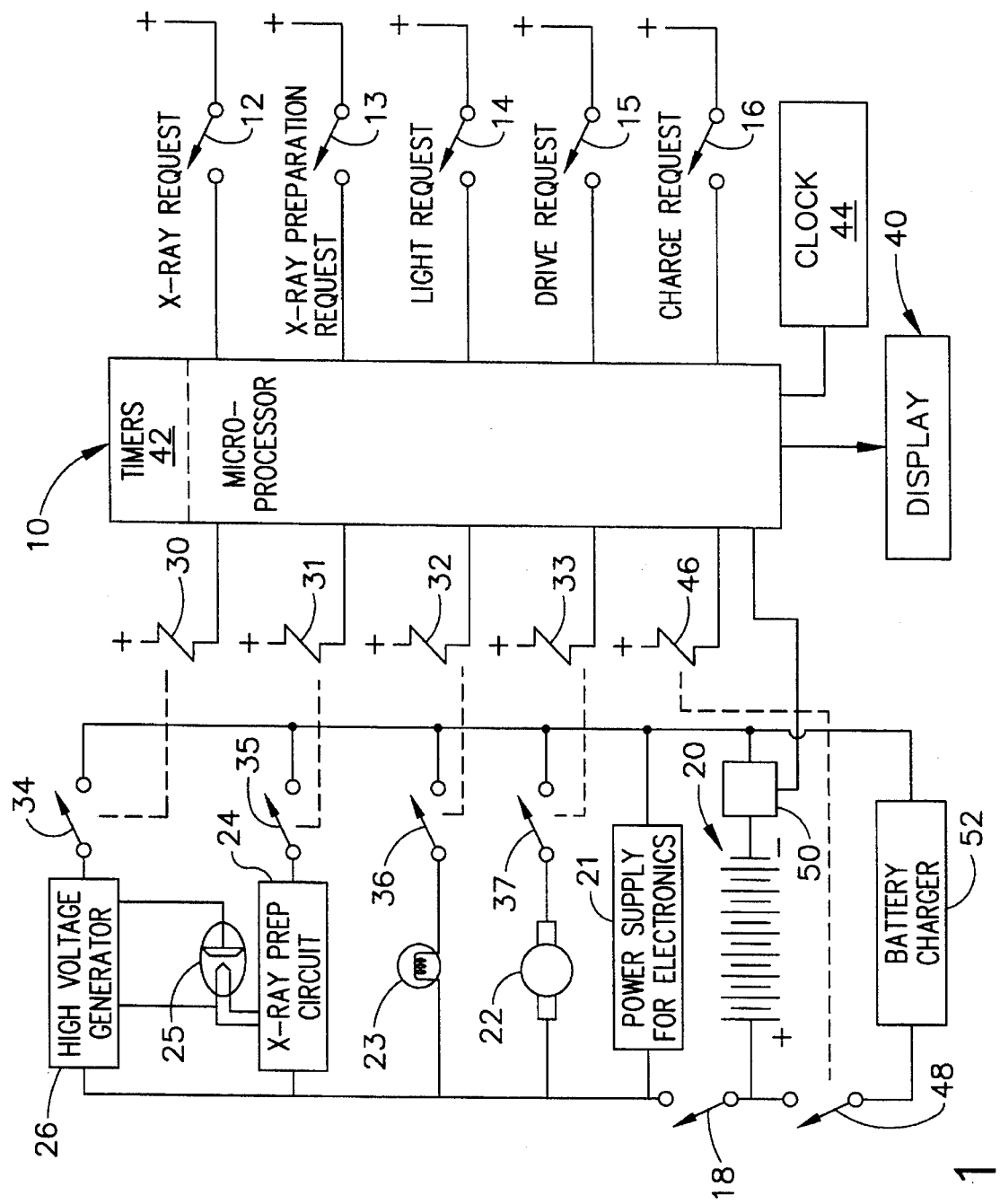
FIG. 1 is a block diagram of a battery powered mobile x-ray device, showing the battery capacity usage monitoring capability and the display means.

Referring now to FIG. 1, there is illustrated a block diagram of a battery powered mobile x-ray unit operated by a programmed microprocessor 10 which receives commands from a set of switches 12–16 that indicate mode of operation. When ON/OFF switch 18 is closed, the microprocessor 10 and other electrical components of the x-ray unit are powered by a rechargeable battery 20, which in the preferred embodiment is a lead-acid battery. The battery 20 drives a power supply 21 which provides electrical power of the desired voltage to the electrical circuits, including microprocessor 10, and it supplies much larger amounts of power to a number of other devices. These other devices include a drive motor 22 which propels the x-ray unit from one location to another, and a field light 23 which illuminates the area of the patient which will be x-rayed. When an x-ray is taken, the battery also supplies power to x-ray preparation circuits 24 that prepare an x-ray tube 25 for an exposure by heating its filament and rotating its anode. A high voltage generator 26 is enabled during the prescribed exposure time to provide the prescribed MA dose.

In response to commands input through the switches 12–16, the microprocessor 10 energizes relays 30, 31, 32, 33 to operate corresponding contacts 34, 35, 36, 37 in circuit with the operating elements 22, 23, 24, 25, 26. The microprocessor 10 thus controls which elements receive current from the battery 20 and for how long. As will be described below, this can be used to closely approximate the current discharged from the battery 20 and to provide an indication of the battery condition on a display 40, or as information to the PER determination, described in more detail below, with reference to block 208 of FIG. 2.

There are five distinct loads on the battery 20 when the x-ray unit is turned on. These include: "idle" energy which is required by the electronics power supply 21; "drive" energy which is required by the motor 22 to propel the unit;

"field light" energy which is required when the light 23 is turned on; "prep" energy which is required by circuit 24 to prepare the x-ray tube 25; and "x-ray" energy delivered by the tube 25 during the prescribed exposure. All of these loads except the drive motor 22 are relatively constant, known values. In the preferred embodiment, the drive motor current is assumed to be constant at a level required to propel the unit at the top speed on a level surface. For these modes of operation, the energy discharged from the battery 20 is as follows:

$$\text{idle energy} = \text{elapsed idle time} \times 300\text{mA} \quad \text{(Eq.1)}$$

$$\text{drive energy} = \text{elapsed drive time} \times 3000\text{mA} \quad \text{(Eq.2)}$$

$$\text{field light energy} = \text{elapsed light time} \times 2500\text{mA} \quad \text{(Eq.3)}$$

$$\text{prep energy} = \text{elapsed prep time} \times 300\text{mA} \quad \text{(Eq.4)}$$

The x-ray energy discharged is determined from the exposure prescription:

$$\text{x-ray energy} = \text{cumulative exposure energy} \times \text{conversion factor,} \quad \text{(Eq.5)}$$

where "conversion factor" is a measure of the x-ray generator efficiency and is thirteen in the preferred embodiment.

Continuing with FIG. 1, associated with the microprocessor 10 is a crystal controlled clock 44 to achieve highly accurate timebase as well as timers 42 based on the clock 44, for measuring the elapsed time in various operating modes. Thus, capacity removed from the battery can be approximated using a sum of the energy equations 1–5 above, by subtracting the sum of the energy equations from the current remaining battery capacity. An optional electronic meter 50 can be included as an alternate method of measuring battery usage. When a charge request becomes active at switch 16, the microprocessor 10 energizes a charge relay 46 which closes contact 48. An ammeter can be used to measure the current returned to the battery during charging.

Figure 2:
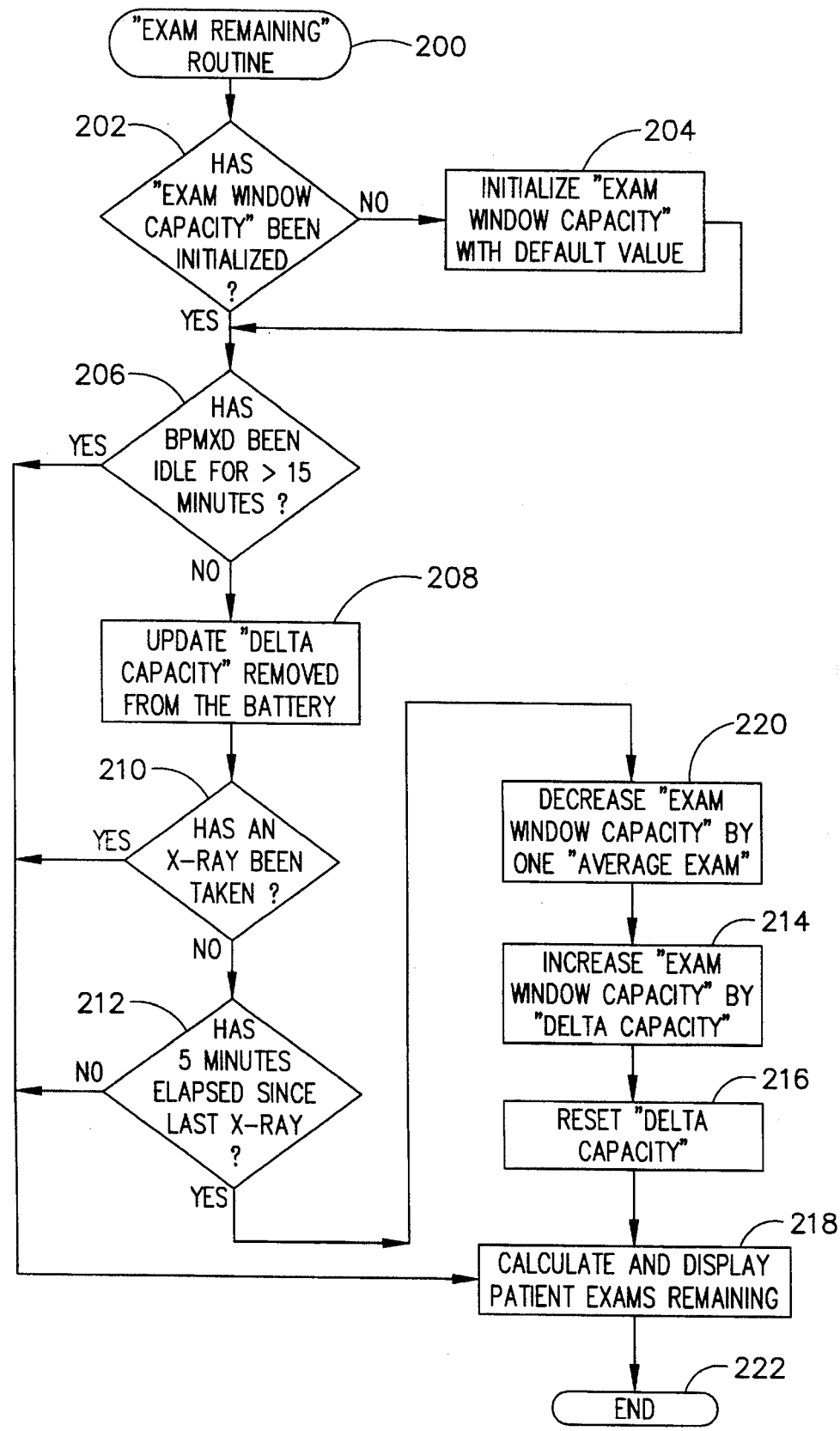
FIG. 2 is a flow chart illustrating the steps employed to determine and display for the operator the patient exams remaining on the battery powered mobile x-ray device.

Referring now to FIG. 2 and continuing with FIG. 1, approximately every five seconds, for example, the microprocessor 10 updates the display 40 with a value indicating the patient exams remaining. In order to implement a "PATIENT EXAMS REMAINING" function, the term "EXAMS" must first be defined. Typically, an "EXAM" consists of various components including driving the BPMXD to the patient vicinity, positioning the BPMXD in the patient vicinity, preparing the BPMXD for an x-ray exposure, taking the x-ray exposure, re-positioning and taking additional x-ray exposures. The x-ray technician may take a number of x-ray exposures within a short period of time. An "EXAM" can therefore be defined as any amount of usage required to take a series of x-ray exposures occurring within a predetermined time.

In order to obtain stable results, "PATIENT EXAMS REMAINING" must be based on the battery capacity used over a large number of exams. The number of exams can be denoted by "EXAM WINDOW", and the battery capacity used during this "EXAM WINDOW" can be denoted by "EXAM WINDOW CAPACITY". Thus "PATIENT EXAMS REMAINING" (PER) can be determined as follows:

$$PER = \frac{\text{Remaining Battery Capacity}}{\text{(AVERAGE EXAM CAPACITY)}} \quad \text{(Eq. 6)}$$

where $$\text{AVERAGE EXAM CAPACITY} = \frac{\text{EXAM WINDOW CAPACITY}}{\text{EXAM WINDOW}} \quad \text{(Eq. 7)}$$

This result can then be displayed at display means 40 in any suitable manner which enables the BPMXD operator to determine if the battery 20 has sufficient capacity to complete the desired number of exams, or if a battery recharge is required by battery charger 52.

As will be obvious to those skilled in the art, the sensitivity of the PER determination is based on the value of "EXAM WINDOW". The larger the value for "EXAM WINDOW", the more stable the "PATIENT EXAMS REMAINING" determination will be. However, the larger the value for "EXAM WINDOW", the longer it will take for the BPMXD to adjust to changes in usage patterns. Again, though, if the value of "EXAM WINDOW" is too small, the "PATIENT EXAMS REMAINING" determination may be erratic. This is more easily understood by reference to FIG. 2, wherein a program which updates the display 40 with a value indicating the patient exams remaining, is illustrated.

When the BPMXD is turned on with ON/Off switch 18, as indicated at block 200, the battery 20 provides power to various components. The battery usage is monitored for indicating remaining battery capacity by any suitable monitoring means such as an amphour meter 50 or via the elapsed time means discussed above. Once the BPMXD is turned on the microprocessor 10 begins program execution of "EXAMS REMAINING", illustrated in FIG. 2, on a predetermined interval, such as a five second interval. When the program is entered, it is determined at decision block 202 whether the "EXAM WINDOW CAPACITY" has been initialized. In the case of a newly manufactured product, this parameter would not have been initialized, so the program proceeds to block 204 where the "EXAM WINDOW CAPACITY" is initialized with a default value before proceeding to decision block 206.

If the BPMXD has been in an idle mode for greater than a predetermined excess idle time, such as, for example, fifteen minutes, battery usage during this idle period is not added to the EXAM WINDOW CAPACITY. Program control proceeds to block 218, where PER is calculated according to Equation 6 above, and displayed. Control then exits the EXAMS REMAINING routine at block 222. This feature is provided to deal with the case in which the BPMXD operator inadvertently leaves the ON/OFF switch 18 in the "ON" position for extended periods of time.

If the BPMXD has not been in an idle mode for greater than the predetermined excess idle time, program control continues to block 208, to update the amount of capacity removed from the battery during the current EXAM. This capacity is denoted "DELTA CAPACITY". Program control then continues to decision block 210. If an x-ray was taken since block 210 was last executed, program control proceeds to block 218, where PER is calculated according to Equation 6 above, and displayed. The program control then exits at block 222.

If an x-ray was not taken since block 210 was last executed, then it is determined at decision block 212 whether a predetermined time, such as, for example, five minutes have elapsed since the last x-ray. If the predetermined time, five minutes in this example, has not elapsed since the last x-ray was taken, program control proceeds to block 218, to calculate and display PER, before exiting the EXAMS REMAINING routine at block 222. If the predetermined time, for example five minutes, has elapsed since the last x-ray was taken, an EXAM can be considered complete, and program execution continues to block 220, where the value of the "EXAM WINDOW CAPACITY" is decreased by the magnitude of AVERAGE EXAM CAPACITY, as defined above. Program control then continues to block 214. At this program step, the "EXAM WINDOW CAPACITY" is increased by "DELTA CAPACITY", a value which has been integrated over the previous EXAM at block 208. Control then passes to block 216, where the value of "DELTA CAPACITY" is set to zero in preparation for the next EXAM. Program execution then continues to block 218 where the PER is calculated according to Equation 6, and displayed. Program control then exits the EXAMS REMAINING routine at block 222.

The present invention, therefore, provides for a system and method of determining the number of patient exams remaining in a battery powered mobile x-ray device. As illustrated in FIG. 2, the current drawn from the battery is measured as the system operates, so the remaining capacity of the battery can be calculated. In accordance with the present invention, the remaining capacity of the battery can be adjusted, based on usage of the system in each particular application. Patient exams remaining is then calculated, based on the adjusted calculated remaining capacity of the battery, and displayed.

The invention has been described in detail with particular reference to certain preferred embodiments thereof, but it will be understood that modifications and variations can be effected within the spirit and scope of the invention.

We claim:

1. In a system which employs a battery for operation, the combination comprising:

means for measuring current drawn from the battery as the system operates;

means for calculating remaining capacity of the battery;

means for adjusting the remaining capacity of the battery based on usage of the system in each particular application;

means for calculating patient exams remaining based on the adjusted calculated remaining capacity of the battery; and means for displaying the calculated patient exams remaining.

2. The system as claimed in claim 1 wherein the means for calculating patient exams remaining comprises a formula of patient exams remaining being equal to remaining battery capacity divided by an average exam capacity.

3. The system as claimed in claim 2 wherein the average exam capacity is equal to number of exams divided by battery capacity used during the number of exams.

4. The system as claimed in claim 3 further comprising means for adjusting the number of exams.

5. A method for determining exams remaining in a battery powered mobile x-ray device, comprising the steps of:

measuring current drawn from the battery as the device operates;

calculating remaining capacity of the battery;

adjusting the remaining capacity of the battery based on usage of the device in each particular application;

calculating patient exams remaining based on the adjusted calculated remaining capacity of the battery; and displaying the calculated patient exams remaining.

6. A method as claimed in claim 5 wherein the step of calculating patient exams remaining comprises the step of calculating patient exams remaining as equal to remaining battery capacity divided by an average exam capacity.

7. A method as claimed in claim 6 wherein the average exam capacity is equal to number of exams divided by battery capacity used during the number of exams.

8. A method as claimed in claim 7 further comprising the step of adjusting the number of exams.

9. A method as claimed in claim 5 further comprising the step of updating battery capacity based on previous usage when an excess idle time occurs.

* * * * *